(12) United States Patent
Dani

(10) Patent No.: US 11,515,630 B2
(45) Date of Patent: Nov. 29, 2022

(54) DYNAMIC SUPPLY MODULATION POWER AMPLIFIER ARCHITECTURE FOR MILLIMETER WAVE APPLICATIONS

(71) Applicant: Metawave Corporation, Palo Alto, CA (US)

(72) Inventor: Asmita Dani, San Jose, CA (US)

(73) Assignee: METAWAVE Corporation, Carlsbad, CA (US)

(*) Notice: Subject to any disclaimer, the term of this patent is extended or adjusted under 35 U.S.C. 154(b) by 682 days.

(21) Appl. No.: 16/530,970

(22) Filed: Aug. 2, 2019

(65) Prior Publication Data

US 2020/0044336 A1 Feb. 6, 2020

Related U.S. Application Data

(60) Provisional application No. 62/713,927, filed on Aug. 2, 2018.

(51) Int. Cl.
*H01Q 3/34* (2006.01)
*G01S 13/931* (2020.01)
(Continued)

(52) U.S. Cl.
CPC .............. *H01Q 3/34* (2013.01); *B60W 50/00* (2013.01); *G01S 7/032* (2013.01); *G01S 13/931* (2013.01);
(Continued)

(58) Field of Classification Search
CPC ........... B60W 2050/0026; B60W 50/00; G01S 13/931; G01S 7/032; G01S 7/35;
(Continued)

(56) References Cited

U.S. PATENT DOCUMENTS 5,940,030 A 8/1999 Hampel et al.
2012/0194377 A1* 8/2012 Yukumatsu ......... G01S 13/0209
342/368

(Continued)

OTHER PUBLICATIONS

P. Heydari,"Hybrid Architectures Leveraging Best of Both Worlds for eXtreme-Bandwidth Communication, " Nonoscale Communications IC Labs, UCI; IEEEI MS 2018 Workshop—WSD #1, 2018.

(Continued)

*Primary Examiner* — Nguyen T Vo
(74) *Attorney, Agent, or Firm* — Sandra Lynn Godsey

(57) ABSTRACT

Examples disclosed herein relate to a dynamic supply modulation power amplifier architecture for millimeter wave applications. The architecture includes phase shifters coupled to a power input port, power amplifiers coupled to respective power output ports, variable gain amplifiers coupled to the phase shifters and to the power amplifiers and are configured to supply dynamically varying input power to the power amplifiers. The architecture includes a first look-up table coupled to the variable gain amplifiers to control the variable gain amplifiers. The architecture also includes a second look-up table coupled to the power amplifiers, where each of the power amplifiers is supply modulated by active drain voltage modulation controlled by the second look-up table and variable input power from the variable gain amplifiers. Other examples disclosed herein include a radar system for use in an autonomous driving vehicle and an analog beamforming antenna for millimeter wave applications.

20 Claims, 6 Drawing Sheets

(51) Int. Cl.
*H03G 3/30* (2006.01)
*H03F 3/21* (2006.01)
*H03F 3/68* (2006.01)
*G05D 1/02* (2020.01)
*B60W 50/00* (2006.01)
*G01S 7/03* (2006.01)

(52) U.S. Cl.
CPC ............ G05D 1/0257 (2013.01); H03F 3/211 (2013.01); H03F 3/68 (2013.01); H03G 3/3042 (2013.01); *B60W 2050/0026* (2013.01); *H03F 2200/213* (2013.01); *H03F 2200/451* (2013.01); *H03F 2203/21106* (2013.01); *H03G 2201/103* (2013.01); *H03G 2201/307* (2013.01); *H03G 2201/508* (2013.01)

(58) Field of Classification Search
CPC .......... G05D 1/0257; H01Q 3/34; H03F 1/02; H03F 2200/213; H03F 2200/451; H03F 2203/21106; H03F 2203/21193; H03F 3/211; H03F 3/68; H03G 2201/103; H03G 2201/307; H03G 2201/508; H03G 3/3042

See application file for complete search history.

(56) References Cited

U.S. PATENT DOCUMENTS

2019/0103669 A1* 4/2019 Ise ........................ H04B 7/2609
2019/0377059 A1* 12/2019 Kondo ..................... G01S 7/02

OTHER PUBLICATIONS

N. Tran et al., Antenna Array Output Power Minimization Using Particle Swarm Optimization, URSI EM Theory Symposium, EMTS, pp. 1-4, May 2019.

* cited by examiner

DYNAMIC SUPPLY MODULATION POWER AMPLIFIER ARCHITECTURE FOR MILLIMETER WAVE APPLICATIONS

CROSS-REFERENCE TO RELATED APPLICATIONS

This application claims priority from U.S. Provisional Application No. 62/713,927, titled "DYNAMIC SUPPLY MODULATION POWER AMPLIFIER ARCHITECTURE FOR USE IN MILLIMETER WAVE APPLICATIONS," filed on Aug. 2, 2018, and incorporated herein by reference in its entirety.

BACKGROUND

Autonomous driving is quickly moving from the realm of science fiction to becoming an achievable reality. Already in the market are Advanced-Driver Assistance Systems (ADAS) that automate, adapt and enhance vehicles for safety and better driving. The next step will be vehicles that increasingly assume control of driving functions such as steering, accelerating, braking and monitoring the surrounding environment and driving conditions to respond to events, such as changing lanes or speed when needed to avoid traffic, crossing pedestrians, animals, and so on.

An aspect of making this work is the ability to detect and classify targets in the surrounding environment at the same or possibly even better level as humans. Doing so requires sophisticated perception sensors, such as cameras, lidar, and radar. In particular, radars have been used in vehicles for many years and operate in all-weather conditions. Radars also use far less processing than lidar and have the advantage of detecting targets behind obstacles and determining the speed of moving targets. Target detection requires a radar to steer radio frequency (RF) beams at multiple directions across a Field of View (FoV). This imposes design challenges for the radar to provide phase shifts at a multitude of angles while maintaining its power and minimizing signal loss.

BRIEF DESCRIPTION OF THE DRAWINGS

The present application may be more fully appreciated in connection with the following detailed description taken in conjunction with the accompanying drawings, in which like reference characters refer to like parts throughout, and in which.

DETAILED DESCRIPTION

A dynamic supply modulation Power Amplifier (PA) architecture for use in millimeter wave ("mm-wave") applications is disclosed. The dynamic supply modulation PA architecture is suitable for many different mm-wave applications and can be deployed in a variety of different environments and configurations. Mm-wave applications are those operating with frequencies between 30 GHz and 300 GHz or a portion thereof, including autonomous driving applications in the 77 GHz range and 5G applications in the 60 GHz range, among others. In various examples, the dynamic supply modulation PA architecture is incorporated in a radar in an autonomous driving vehicle having an analog beamforming antenna. The analog beamforming antenna is capable of steering multiple beams across a full 360° FoV with the use of phase shifters designed for mm-wave operation. As these phase shifters may suffer from variable loss at different angles, the dynamic supply PA architecture described herein below enables the antenna to compensate for the amplitude imbalance caused by this loss.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology. In other instances, well-known methods and structures may not be described in detail to avoid unnecessarily obscuring the description of the examples. Also, the examples may be used in combination with each other.

Figure 1:
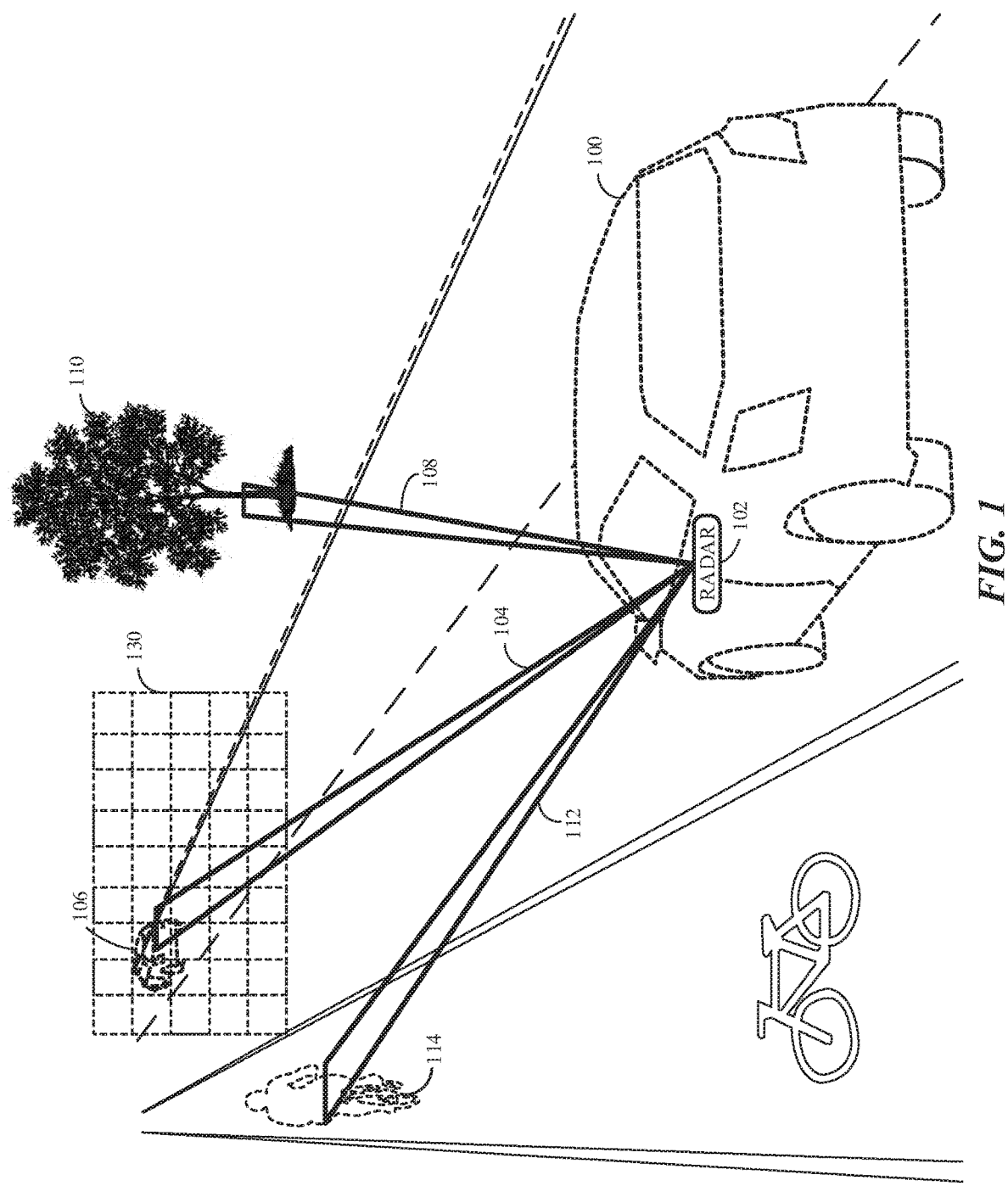
FIG. 1 illustrates an example environment in which a radar in an autonomous vehicle radar is used to detect and identify targets.

FIG. 1 illustrates an example environment in which a radar in an autonomous vehicle radar is used to detect and identify targets. Ego vehicle 100 is an autonomous vehicle having a radar 102 with an analog beamforming antenna. In various examples and as described in more detail below, radar 102 is capable of scanning a 360° FoV to have a true 3D vision and human-like interpretation of the ego vehicle's path and surrounding environment. For example, the radar 102 can scan the ego vehicle's path and surrounding environment horizontally and/or vertically, or in other directions, across a virtual scanning grid 130. The radar 102 is capable of shaping and steering RF beams in all directions in a 360° FoV and recognizing targets quickly with a high degree of accuracy over a long range of around 300 meters or more. The analog beamforming antenna in radar 102 radiates dynamically controllable and highly-directive RF beams. The RF beams reflect from targets in the vehicle's path and surrounding environment and the RF reflections are received by the radar 102 for target detection and identification.

In the illustrated example, radar 102 generates a beam 104 to detect vehicle 106, a beam 108 to detect a tree 110 and a beam 112 to detect a bicycle 114. Each of the beams 104, 108 and 112 is generated with a set of parameters, such as beam width and phase. The phase of each beam is controlled by Phase Control Elements (PCE) in the analog beamforming antenna in radar 102. A PCE may include a varactor, a set of varactors, or a phase shift network to achieve any desired phase shift from 0° to 360°.

Figure 2:
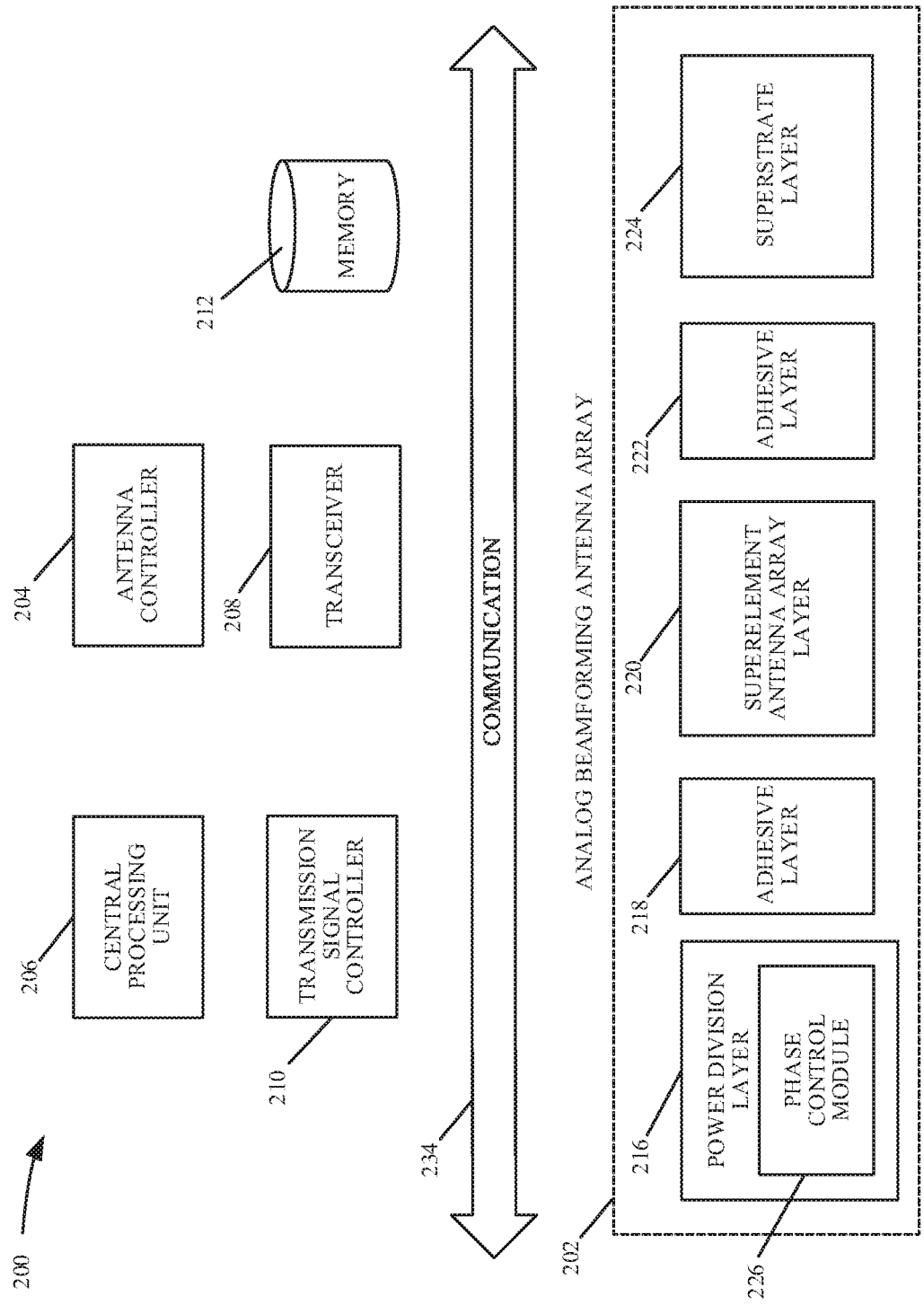
FIG. 2 is a schematic diagram of an analog beamforming antenna for use with the radar of FIG. 1 in accordance with various examples.

FIG. 2 shows a schematic diagram of an analog beamforming antenna for use with the radar of FIG. 1 in accordance with various examples. Analog beamforming antenna 200 has an analog beamforming antenna array 202 coupled to an antenna controller 204, a central processing unit 206, and a transceiver 208. A transmission signal controller 210 generates a transmission signal, such as a Frequency Modulated Continuous Wave (FMCW) signal, which is used for radar applications as the transmitted signal is modulated in frequency, or phase. The FMCW signal enables a radar to measure range to a target by measuring the phase differences in phase or frequency between the transmitted signal and the received or reflected signal. The FMCW signal is provided to the antenna 200 and the transmission signal controller 210 may act as an interface, translator or modulation controller, or otherwise as required for the signal to propagate through a transmission line system. The received information is stored in a memory storage unit 212, in which the information structure may be determined by the type of transmission and modulation pattern.

In various examples, the analog beamforming antenna array 202 radiates the signal through a structure consisting of three main layers: power division layer 216, superelement antenna array layer 220 and a superstrate layer 224, interspersed by two adhesive layers 218 and 222. The power division layer 216 is a corporate feed structure having a plurality of transmission lines for transmitting the signal to superelement arrays in the superelement antenna array layer 220. Each superelement in the superelement antenna array layer 220 includes a plurality of radiating slots for radiating the signal into the air. The slots are configured in a specific pattern, but other patterns, shapes, dimensions, orientations and specifications may be used to achieve a variety of radiation patterns. The power division layer 216 has a phase control module 226 for achieving different phase shifts in the radiated RF signals. The phase control module 226 may include a number of PCEs RF integrated circuits having a varactor, a network of varactors, or a phase shift network to achieve phase shifts anywhere in a range of 0° to 360° and thereby enable full scanning of an entire FoV. The superstrate layer 224 is used to increase the efficiency and directivity of the analog beamforming antenna array 202, and the adhesive layers 218 and 222 are made of adhesive material to glue the layers 216, 220 and 224 together. The adhesive layers 218 and 222 may be, for example, preimpregnated ("prepreg") bonding sheets.

Note that as illustrated, there is one analog beamforming antenna array 202 in analog beamforming antenna 200. However, an analog beamforming antenna 200 may have multiple analog beamforming antenna arrays in any given configuration. A set of analog beamforming antennas may be designated as transmit antennas, and another set may be designated as receive antennas. In various examples, a transmit antenna may radiate a beam at a fixed direction, and a receive antenna may steer in multiple directions. Further, an analog beamforming antenna may be orthogonal from another. Different analog beamforming antennas may also have different polarizations. In various examples, different analog beamforming antennas may be configured to detect different targets, e.g., a set of antennas may be configured to enhance the detection and identification of pedestrians, another set of antennas may be configured to enhance the detection and identification of vehicles, and so forth. In the case of pedestrians, the configuration of the antennas may include power amplifiers to adjust the power of a transmitted signal and/or different polarization modes for different arrays to enhance pedestrian detection. It is appreciated that numerous configurations of analog beamforming antennas may be implemented.

In operation, transceiver 208 prepares a signal for transmission, such as a signal for a radar device, in which the signal is defined by modulation and frequency. The signal is received by the analog beamforming antenna array 202 and the desired phase of the radiated signal is adjusted by phase control module 226 at the direction of the antenna controller 204. The transmission signal controller 210 generates the transmission signal and provides it to the analog beamforming antenna array 202, such as through a coaxial cable or other connector. The signal propagates through the power division layer 216 to the superelement antenna array 220 and superstrate 224 for transmission through the air.

The antenna structure of FIG. 2 may be referred to as a type of Slotted Wave Guide Antenna (SWGA), in which the power division layer 216 acts as a feed to superelement antenna array 220. Alternate examples may reconfigure and/or modify the antenna structure to improve radiation patterns, bandwidth, side lobe levels, and so forth. The antenna performance may be adjusted by design of the antenna's features and materials, such the shape of the slots, slot patterns, slot dimensions, conductive trace materials and patterns, as well as other modifications to achieve impedance matching and so forth.

In some examples, analog beamforming antenna array 202 can be implemented in many applications, including radar, cellular antennas, and autonomous vehicles to detect and identify targets in the path of or surrounding the vehicle. Alternate examples may use the analog beamforming antenna for wireless communications, medical equipment, sensing, monitoring, and so forth. Each application type incorporates designs and configurations of the elements, structures and modules described herein to accommodate their needs and goals.

Figure 3:
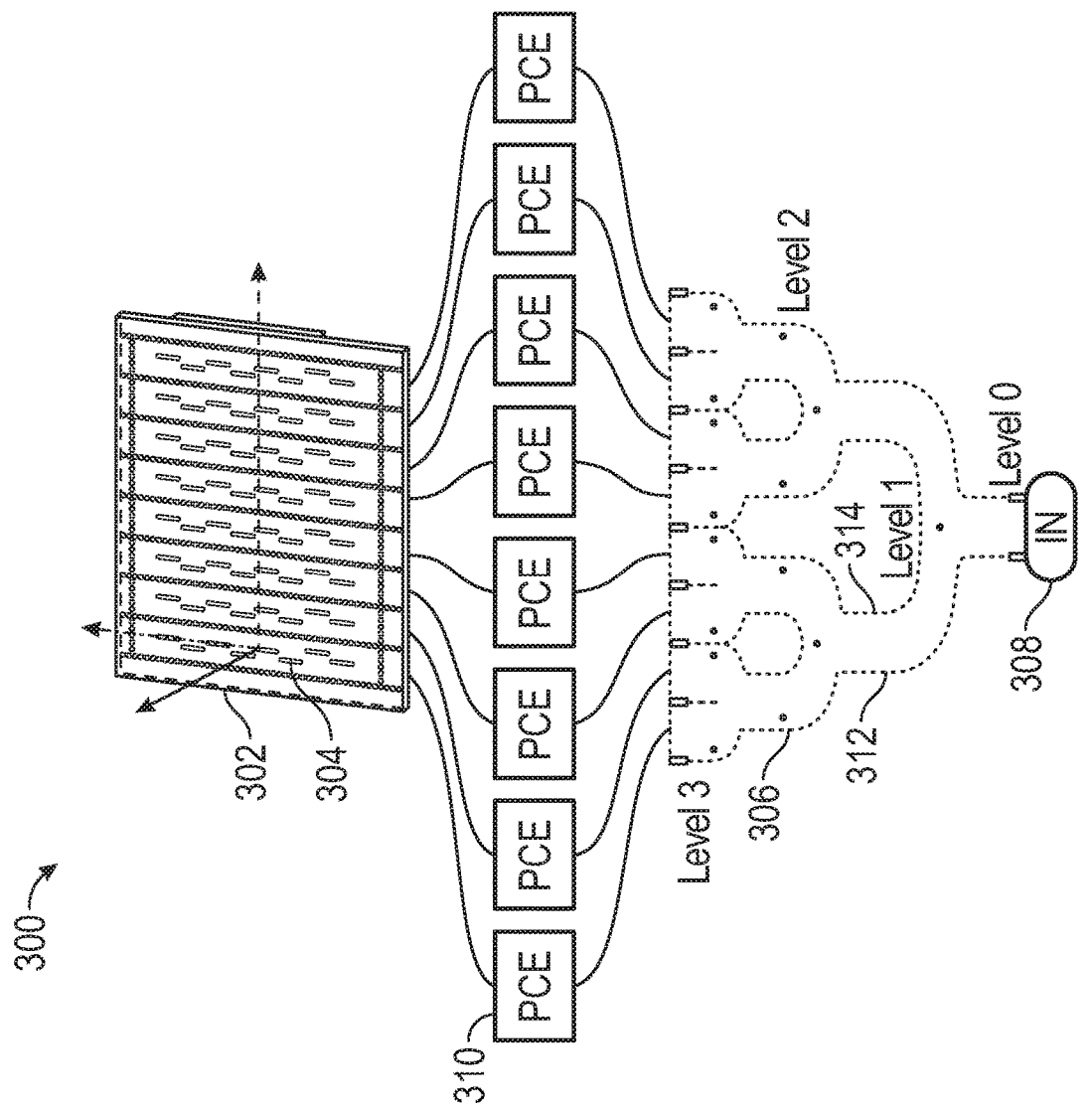
FIG. 3 illustrates a system level overview of the analog beamforming antenna array of FIG. 2.

Attention is now directed to FIG. 3, which shows a system level overview of the analog beamforming antenna array of FIG. 2. Analog beamforming antenna array 300 includes a superelement antenna array 302 that includes an 8×8 antenna array of 8 superelements and 8 radiating elements/slots in each superelement, e.g., slot 304. Each superelement is fed by a transmission line bounded by vias in a corporate feed 306, which divides a transmission signal received from a transmission signal controller (e.g., transmission signal controller 210 of FIG. 2) for propagation to the superelement antenna array 302. In the illustrated example, the feed network 306 is a type of a power divider circuit such that it takes an input signal at 308 and divides it through a network of paths or transmission lines. Each path may have similar dimensions; however, the size of the paths may be configured to achieve a desired transmission and/or radiation result. Each transmission line is a path in the feed network 306, which is shown to have 3 levels, in which in each level the feed network 300 doubles its paths: level 0 has 1 path, level 1 has 2 paths, level 2 has 4 paths, and level 3 has 8 paths. The feed network 300 is designed to be impedance-matched, such that the impedances at each end of a transmission line matches the characteristic impedance of the line. Each transmission line is bounded by a set of vias, such as vias 312 and 314. Matching vias may also be provided for better impedance matching and phase control.

Phase control is achieved in the analog beamforming antenna array 300 by a set of PCEs coupled to the feed network 306, such as PCE 310. Each PCE may be in an RFIC in a substrate layer coupled to the feed network 306 and able to achieve any desired phase shift from 0° to 360°.

As illustrated, each PCE is coupled to a superelement in the superelement antenna array 302, totaling 8 PCEs for the 8×8 antenna array and providing many degrees of freedom in phase. With the arrangement of having one PCE per each superelement, the analog beamforming antenna array 300 can provide analog beamforming/beamsteering across a 360° FoV in both azimuth and elevation.

In various examples, a PCE in the analog beamforming antenna array 300 may be a varactor, a set of varactors, or a phase shift network incorporating a distributed varactor network. The phase shift network may include 3 distributed varactor networks: one capable of achieving phase shifts from 0 to 120°, one capable of achieving phase shifts from 120° to 240°, and another capable of achieving phase shifts from 240° to 360°. Each distributed varactor network is built with multiple varactors designed to operate in millimeter wave frequencies. The phase shift network achieves significantly lower losses than traditional phase shift networks. Such losses may be anywhere from 10 to 17 dB and vary with the phase shift.

As each PCE operates in millimeter wave frequencies, it may experience a power loss that may vary with the phase shift, e.g., PCE 310 may have a loss of 10 dB at 40°, a loss of 13 dB at 23°, a loss of 14 dB at 56°, and so on. A variable power loss is, however, undesirable in autonomous driving applications that require high performance beam steering to detect and identify targets. Power amplifiers (PAs) may be used to counter the variable loss from the PCEs with amplifier gain. Simply coupling a PA to each PCE may not, however, result in an optimal design. As each superelement in superelement antenna array 302 is coupled to a PCE, heat dissipation may be significant. It is therefore critical to balance the PCE loss with PAs that are not only high gain PAs, but also PAs that achieve this high gain with high efficiency.

Figure 4:
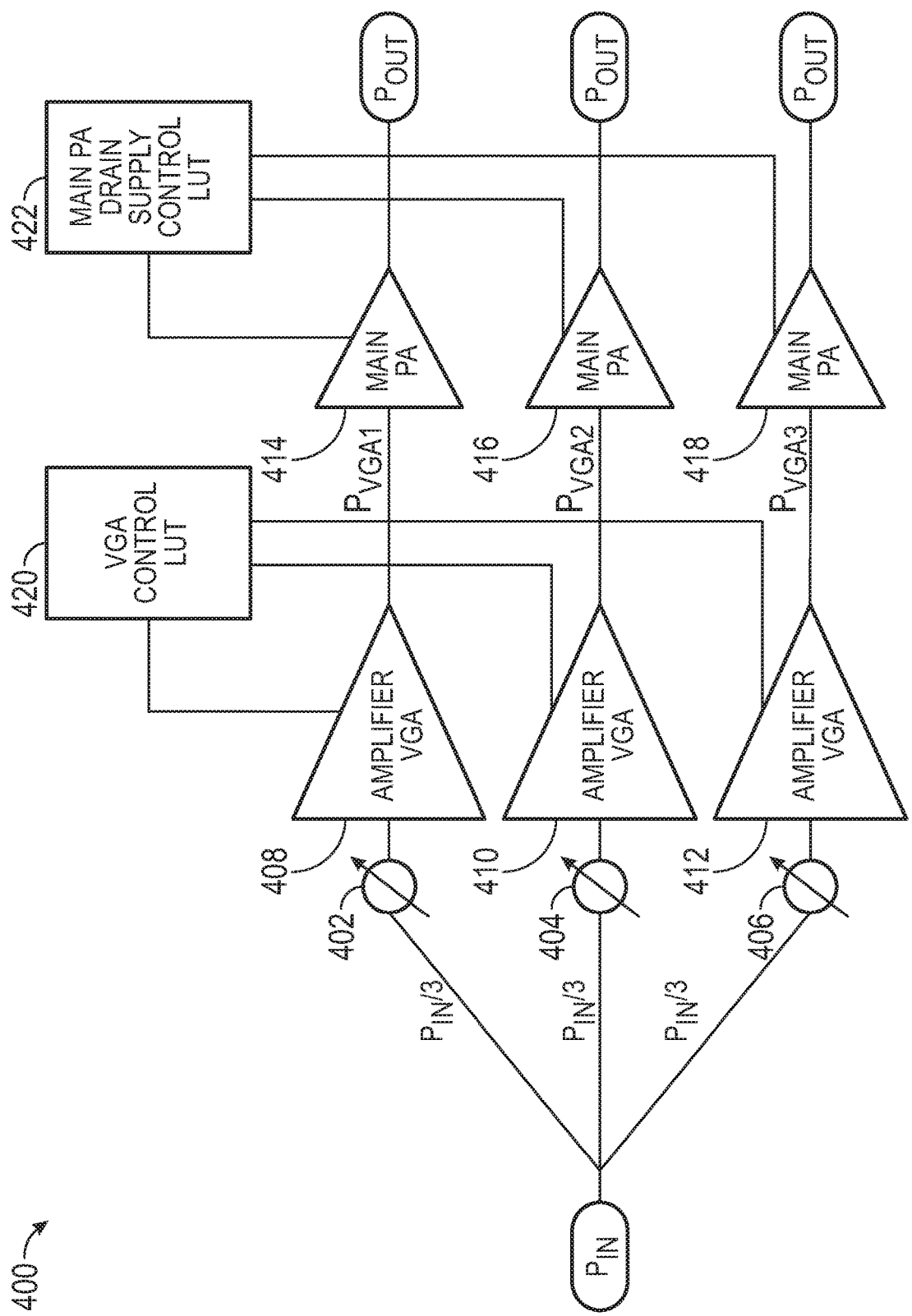
FIG. 4 illustrates a schematic diagram of a dynamic supply modulation power amplifier architecture for use in millimeter wave applications in accordance with various examples.

Attention is now directed to FIG. 4, which illustrates a schematic diagram of a dynamic supply modulation PA architecture 400 to compensate for amplitude imbalance in a feed network. The dynamic supply modulation PA architecture 400 includes phase shifters 402, 404 and 406, amplifiers 408, 410 and 412, power amplifiers 414, 416 and 418, a first look-up table (LUT) 420 and a second LUT 422. Not all of the depicted components may be required, however, and one or more implementations may include additional components not shown in the figure. Variations in the arrangement and type of the components may be made without departing from the scope of the claims as set forth herein. Additional components, different components, or fewer components may be provided.

In FIG. 4, a power input port (depicted as "$P_{IN}$") is coupled to the phase shifters 402, 404 and 406 to form respective input signal paths. Each of the respective input signal paths receives an equivalent fraction of the input signal (denoted as "$P_{IN}/3$"). The output of each of the phase shifters 402, 404 and 406 is coupled to the variable gain amplifiers 408, 410 and 412, respectively. The first look-up table 420 is coupled to a control input of each of the variable gain amplifiers 408, 410 and 412. The output of each of the variable gain amplifiers 408, 410 and 412 is coupled to the power amplifiers 414, 416 and 418, respectively. In this respect, the phase shifter 402 is coupled to the power amplifier 414 through the variable gain amplifier 408, the phase shifter 404 is coupled to the power amplifier 416 through the variable gain amplifier 410, and the phase shifter 406 is coupled to the power amplifier 416 through the variable gain amplifier 412. The second look-up table 422 is coupled to a drain terminal of each of the power amplifiers 414, 416 and 418. The output of each of the power amplifiers 414, 416 and 418 is coupled to a respective power output port (depicted as "$P_{OUT}$").

The dynamic supply modulation PA architecture 400 is an example PCE architecture having a phase shift network of three phase shifters, namely the phase shifters 402, 404 and 406. Each phase shifter (e.g., 402, 404, 406) may be, or include at least a portion of, a distributed varactor network or other such phase shifter for achieving a range of phase shifts in millimeter wave frequencies. For example, the phase shifter 402 may be capable of applying phase shifts in a range of 0 to 120°, phase shifter 404 may be capable of applying phase shifts in a range of 120° to 240°, and phase shifter 406 may be capable of applying phase shifts in a range of 240° to 360°.

As described above, each of the phase shifters 402, 404, 406 may suffer from loss that is compensated by the addition of a PA: PA 414 for phase shifter 402, PA 416 for phase shifter 404, and PA 418 for phase shifter 406. Each of PAs 414, 416 and 418 is supply modulated to achieve higher efficiency for a large dynamic range of output power levels. The supply modulation may be performed by active drain voltage modulation combined with variable input power fed from the amplifiers 408, 410, 412. The modulation is implemented with the drain supply control LUT 422 coupled to each PA. The goal of PCE architecture 400 is to maintain the amplitude balance and efficiency levels for each of the super element feed arms in feed network 306 at different beam steering angles.

In some implementations, each of the amplifiers 408, 410 and 412 is, or includes at least a portion of, a variable gain amplifier (VGA). In order to keep the power split symmetric for the superelements in array 302, the amplifiers 408, 410 and 412 (denoted hereinafter as "VGAs 408, 410, 412") are introduced before PAs 414, 416 and 418. Each of the VGAs 408, 410, 412 provides a wide range of input drive levels to the final stage PAs 414, 416 and 418. The VGAs 408, 410, 412 operate in small signal range to provide the input dynamic range to the PAs 414, 416 and 418 in order to achieve the amplitude imbalance compensation and maintain efficiency across the feed arms. Further, the VGAs 408, 410, 412 can supply dynamically varying input power levels to the final stage supply modulated PAs 414, 416 and 418 in order to maintain total output power and efficiency. The VGAs 408, 410, 412 are controlled by VGA control LUT 420.

Figure 5:
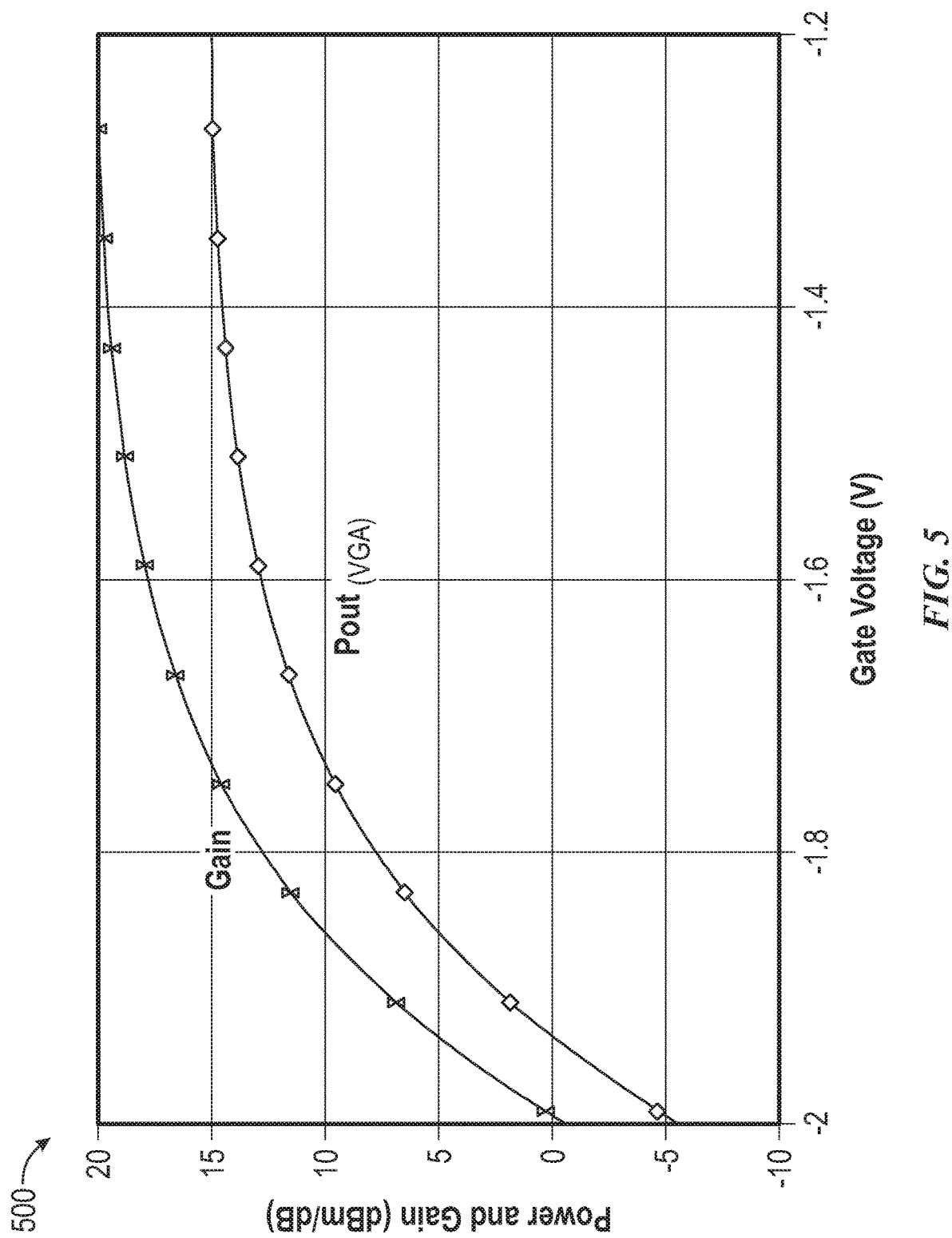
FIG. 5 is a graph showing the gate voltage and power gain of a VGA in the dynamic supply modulation power amplifier architecture of FIG. 4.
Figure 6:
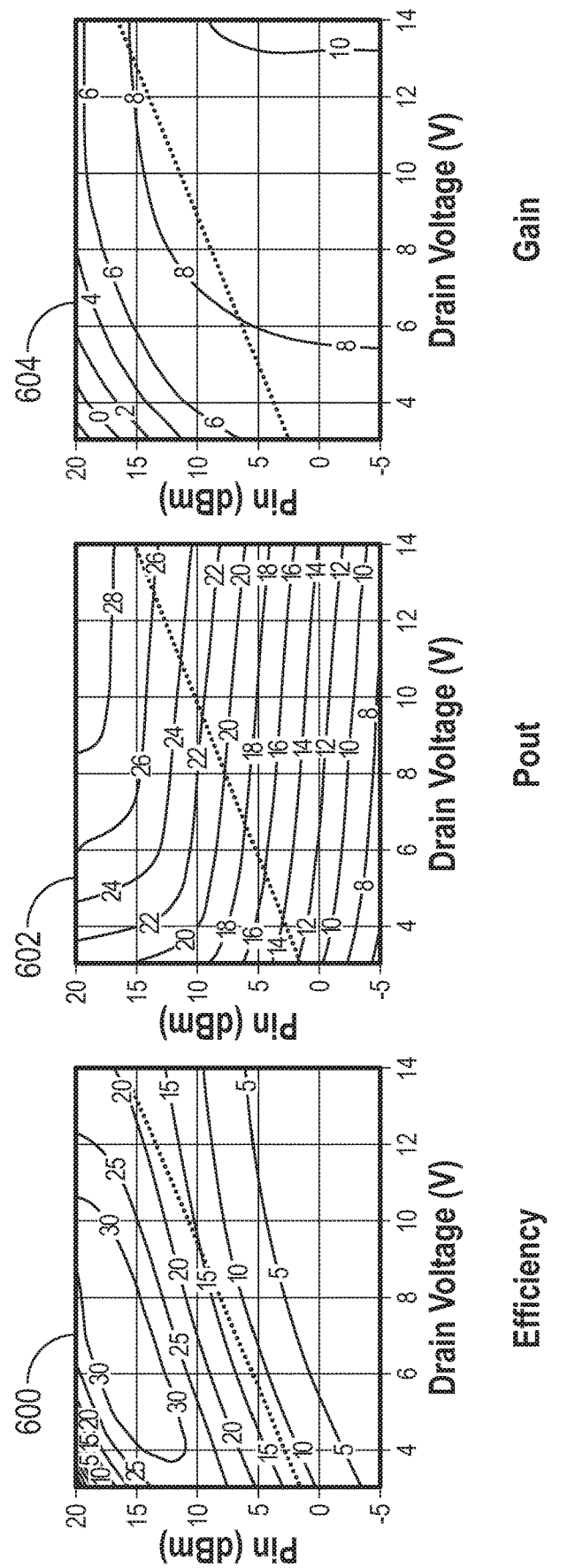
FIG. 6 are graphs showing the behavior of the main power amplifiers in the dynamic supply modulation power amplifier architecture of FIG. 4.

FIG. 5 is a graph showing the gate voltage and power gain of a VGA in the dynamic supply modulation power amplifier architecture of FIG. 4. Graph 500 shows the variations in power and gain achieved by each VGA 408-412 with varying gate voltages for the first LUT 420. FIG. 6 are graphs showing the behavior of the main PAs 414-418 in the dynamic supply modulation power amplifier architecture 400 of FIG. 4. Graph 600 shows the efficiency of the PAs 414-418, graph 602 shows the output power, and graph 604 shows the gain.

Note that in graph 600, efficiency is maintained at about the same level with varying voltage. The dynamic supply modulation PA architecture 400 is therefore able to compensate for phase shifter losses while achieving a high gain and maintaining a high efficiency. The result is that the analog beamforming antenna array 300 is capable of high performance analog beamsteering at any direction within a full 360° FoV, thereby enabling an autonomous vehicle to identify and detect targets in its path and surrounding environment.

These various examples support autonomous driving with improved sensor performance, all-weather/all-condition detection, advanced decision-making algorithms and interaction with other sensors through sensor fusion. These configurations optimize the use of radar sensors, as radar is not inhibited by weather conditions in many applications, such as for self-driving cars. The ability to capture environmental information early aids control of a vehicle, allowing anticipation of hazards and changing conditions. Sensor performance is also enhanced with these structures, enabling long-range and short-range visibility. In an automotive application, short-range is considered within 30 meters of a vehicle, such as to detect a person in a cross walk directly in front of the vehicle; and long-range is considered to 250 meters or more, such as to detect approaching cars on a highway. These examples provide automotive radars capable of reconstructing the world around them and are effectively a radar "digital eye," having true 3D vision and capable of human-like interpretation of the world.

It is also appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Furthermore, to the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. Moreover, the separation of various system components in the aspects described above should not be understood as requiring such separation in all aspects, and it should be understood that the described program components and systems can generally be integrated together in a single hardware product or packaged into multiple hardware products. Other variations are within the scope of the following claim.

What is claimed is:

1. A radar system for use in an autonomous driving vehicle, comprising an antenna module configured to radiate a transmission signal with an analog beamforming antenna in a plurality of directions based on phase shifts applied by a dynamic supply modulation power amplifier network and to generate radar data capturing a surrounding environment, wherein the dynamic supply modulation power amplifier network comprises:
   a phase shifter network comprising a plurality of phase shifters, and
   an amplifier network comprising a plurality of variable gain amplifiers coupled to the plurality of phase shifters and a plurality of power amplifiers coupled to the plurality of variable gain amplifiers, wherein the plurality of variable gain amplifiers is controlled by a first look-up table and the plurality of power amplifiers is controlled by a second look-up table.

2. The radar system of claim 1, wherein the plurality of power amplifiers is supply modulated by the second look-up table to compensate for amplitude imbalance from the plurality of phase shifters.

3. The radar system of claim 1, wherein the first look-up table is coupled to a control input of each of the plurality of variable gain amplifiers.

4. The radar system of claim 1, wherein the second look-up table is coupled to a drain terminal of each of the plurality of power amplifiers.

5. The radar system of claim 1, wherein each of the plurality of phase shifters includes a distributed varactor network for applying a range of phase shifts to one or more transmission signals.

6. The radar system of claim 5, wherein the distributed varactor network comprises a plurality of varactors that operate at millimeter wave frequencies.

7. The radar system of claim 6, wherein a first phase shifter of the plurality of phase shifters is configured to apply a first phase shift in a range of 0 to 120°, a second phase shifter of the plurality of phase shifters is configured to apply a second phase shift in a range of 120° to 240°, and a third phase shifter of the plurality of phase shifters is configured to apply a third phase shift in a range of 240° to 360°.

8. The radar system of claim 1, wherein each of the plurality of phase shifters applies a different range of phase shifts.

9. The radar system of claim 1, wherein each of the plurality of power amplifiers is supply modulated by active drain voltage modulation at control inputs to the plurality of power amplifiers and variable input power from the plurality of variable gain amplifiers.

10. The radar system of claim 9, wherein the active drain voltage modulation is controlled by the second look-up table.

11. A supply modulation power amplifier network, comprising:
   a plurality of phase shifters coupled to a power input port;
   a plurality of power amplifiers coupled to respective power output ports;
   a plurality of variable gain amplifiers coupled to outputs of the plurality of phase shifters and to inputs to the plurality of power amplifiers and configured to supply dynamically varying input power to the plurality of power amplifiers;
   a first look-up table coupled to the plurality of variable gain amplifiers and configured to vary a power output of the plurality of variable gain amplifiers; and
   a second look-up table coupled to the plurality of power amplifiers and configured to control the plurality of power amplifiers, wherein each of the plurality of power amplifiers is supply modulated by active drain voltage modulation controlled by the second look-up table and variable input power fed from the plurality of variable gain amplifiers.

12. An analog beamforming antenna for millimeter wave applications, comprising:
   a superelement antenna array layer comprising an array of superelements, wherein each superelement in the array of superelements includes a coupling aperture oriented at a predetermined non-orthogonal angle relative to a plurality of radiating slots for radiating a transmission signal;
   a power division layer configured to serve as a feed to the superelement antenna array layer, the power division layer comprising:
      a plurality of phase control elements configured to apply different phase shifts to transmission signals propagating to the superelement antenna array layer, each phase control element comprising an amplifier network that includes a plurality of variable gain amplifiers coupled to a plurality of phase shifters and a plurality of power amplifiers coupled to the plurality of variable gain amplifiers, wherein the plurality of variable gain amplifiers is controlled by a first look-up table and the plurality of power amplifiers is controlled by a second look-up table; and
   a top layer disposed on the superelement antenna array layer.

13. The analog beamforming antenna of claim 12, wherein the plurality of power amplifiers is supply modulated by the second look-up table to compensate for amplitude imbalance from the plurality of phase shifters.

14. The analog beamforming antenna of claim 12, wherein the first look-up table is coupled to a control input of each of the plurality of variable gain amplifiers.

15. The analog beamforming antenna of claim 12, wherein the second look-up table is coupled to a control input of each of the plurality of power amplifiers.

16. The analog beamforming antenna of claim 12, wherein each of the plurality of phase shifters includes a distributed varactor network for applying a range of phase shifts to one or more transmission signals.

17. The analog beamforming antenna of claim 16, wherein the distributed varactor network comprises a plurality of varactors that operate at millimeter wave frequencies.

18. The analog beamforming antenna of claim 12, wherein each of the plurality of phase shifters applies a different range of phase shifts.

19. The analog beamforming antenna of claim 18, wherein a first phase shifter of the plurality of phase shifters is configured to apply a first phase shift in a range of 0 to 120°, a second phase shifter of the plurality of phase shifters is configured to apply a second phase shift in a range of 120° to 240°, and a third phase shifter of the plurality of phase shifters is configured to apply a third phase shift in a range of 240° to 360°.

20. The analog beamforming antenna of claim 12, wherein each of the plurality of power amplifiers is supply modulated by active drain voltage modulation at control inputs to the plurality of power amplifiers and variable input power from the plurality of variable gain amplifiers, wherein the active drain voltage modulation is controlled by the second look-up table.

* * * * *